(12) United States Patent
Wu et al.

(10) Patent No.: US 8,255,855 B2
(45) Date of Patent: Aug. 28, 2012

(54) ROUTING NETS OVER CIRCUIT BLOCKS IN A HIERARCHICAL CIRCUIT DESIGN

(75) Inventors: Yi Wu, Santa Clara, CA (US); Dajen Huang, Sunnyvale, CA (US); Kalon S. Holdbrook, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 384 days.

(21) Appl. No.: 12/490,023

(22) Filed: Jun. 23, 2009

(65) Prior Publication Data

US 2010/0325600 A1  Dec. 23, 2010

(51) Int. Cl.
*G06F 17/50* (2006.01)

(52) U.S. Cl. ........ 716/124; 716/122; 716/123; 716/129; 716/130; 716/131

(58) Field of Classification Search ................ 716/122, 716/123, 124, 129, 130, 131
See application file for complete search history.

(56) References Cited

U.S. PATENT DOCUMENTS

| | | | |
|---|---|---|---|
| 2002/0184607 A1* | 12/2002 | Alpert et al. | 716/15 |
| 2004/0216072 A1* | 10/2004 | Alpert et al. | 716/13 |
| 2005/0138578 A1* | 6/2005 | Alpert et al. | 716/2 |
| 2005/0138589 A1* | 6/2005 | Alpert et al. | 716/10 |
| 2007/0256045 A1* | 11/2007 | Lin et al. | 716/13 |
| 2008/0134119 A1* | 6/2008 | Chen et al. | 716/9 |
| 2008/0256502 A1* | 10/2008 | Papadopoulou et al. | 716/13 |
| 2010/0058268 A1* | 3/2010 | Fein et al. | 716/10 |
| 2010/0077372 A1* | 3/2010 | Xiang et al. | 716/12 |
| 2010/0181685 A1* | 7/2010 | Masleid et al. | 257/775 |
| 2010/0257503 A1* | 10/2010 | Buehler et al. | 716/12 |

* cited by examiner

*Primary Examiner* — Phallaka Kik
(74) *Attorney, Agent, or Firm* — Park, Vaughan, Fleming & Dowler LLP; Laxman Sahasrabuddhe

(57) ABSTRACT

Some embodiments of the present invention provide a system that routes nets over circuit blocks in a hierarchical circuit design. During operation, the system can receive a set of circuit blocks. At least some terminals of the circuit blocks may be desired to be electrically linked together using a net which is expected to be routed over one or more circuit blocks. The system may divide an area associated with a block (e.g., an area in a metal layer which is situated above the block) into a set of tiles. Next, the system may assign costs to at least some of the tiles in the set of tiles. The system can then use the costs during routing. Note that using the costs of the tiles during routing makes it more likely that buffers can be used wherever required to meet slew and timing requirements.

20 Claims, 6 Drawing Sheets

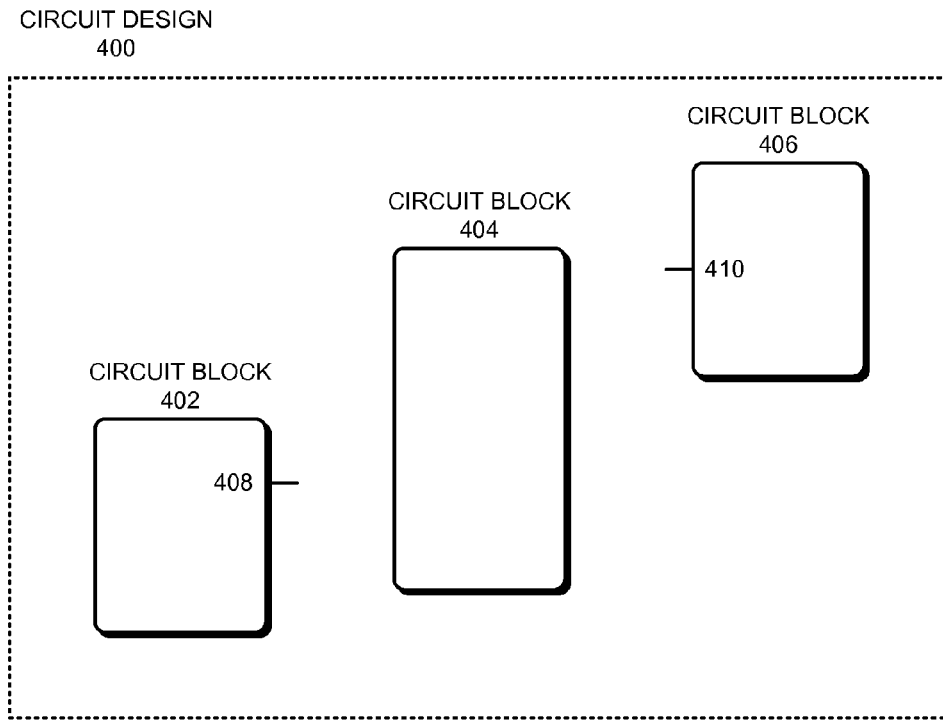
FIG. 4A
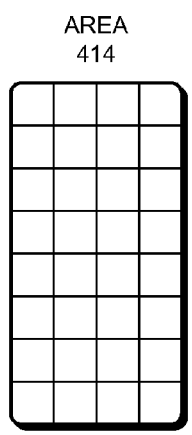 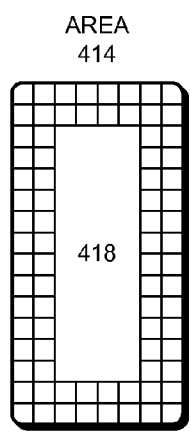 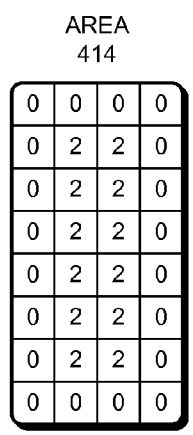 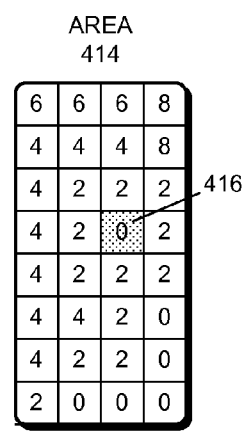
FIG. 4B  FIG. 4C  FIG. 4D  FIG. 4E

ROUTING NETS OVER CIRCUIT BLOCKS IN A HIERARCHICAL CIRCUIT DESIGN

BACKGROUND

1. Field

This disclosure generally relates to electronic design automation. More specifically, this disclosure relates to methods and apparatuses for routing nets over circuit blocks in a hierarchical circuit design.

2. Related Art

Rapid advances in computing technology have made it possible to perform trillions of computational operations each second on data sets that are sometimes as large as trillions of bytes. These advances can largely be attributed to the dramatic improvements in electronic design automation technologies which have made it possible to integrate tens of millions of devices onto a single chip.

Routing is one such electronic design automation technology in which nets are routed to electrically link circuit elements while satisfying the design rules. Typically, a router is given a set of pins or terminals, where each pin is associated with a net. The router's task is to route wires so that all pins associated with the same net are electrically linked together, and pins that are associated with different nets are not electrically linked together. The router typically needs to route the nets so that certain design rules are met. Further, the router can optionally be given a set of pre-determined routes.

The top-level hierarchy in a circuit design can contain a large number of nets which electrically link the terminals of the top-level circuit blocks. These nets can be routed in channels between the blocks and/or over the top of the blocks. Slew and/or timing problems can occur in nets that are routed over a large block, and hence, it is generally desirable to reduce or prevent the occurrence of slew and/or timing problems in such situations.

FIG. 1 illustrates a net that is routed over a circuit block in a hierarchical circuit design.

Circuit design 100 can include circuit blocks 102, 104, and 106. Terminal 108 in circuit block 102 may be desired to be electrically linked with terminal 110 in circuit block 106. A routing engine may route net 112 over circuit block 104 to electrically link terminals 108 and 110. If the portion of net 112 that is routed over circuit block 104 is too long, it may not meet slew and/or timing requirements. Adding buffers or repeaters before and/or after net 112 crosses circuit block 104 may not be sufficient to solve the slew and/or timing problems.

Unfortunately, conventional routing approaches that attempt to fix or avoid such routing-related problems have serious drawbacks. One approach is to prohibit all routing over large blocks. Unfortunately, this approach is impractical because today's chips have active areas that cover 80-90% of the total chip area, and prohibiting all routing over large blocks will most probably make the chip unroutable.

A second approach is to increase the size of the driver that is driving the net. Unfortunately, increasing the size of the driver can create other problems, such as electron-migration problems. Hence, this approach is also not desirable.

A third approach is to create "feedthrough" nets that go through a block (instead of being routed over the block) so that the nets can be buffered inside the block. This approach may work for a few nets, but the approach is impractical for general use because of the sheer number of nets that need to be routed. Furthermore, it is very difficult to allocate and use resources efficiently in this approach.

A fourth approach is to selectively expose some buffers (also known as embedded repeaters) inside a block so that their pins are visible at the top level and can be used to buffer long nets that are being routed over the block. This approach is also impractical because it interrupts the circuit block's floorplan and routing. Moreover, it is very difficult to allocate and use resources efficiently in this approach.

Hence, what is needed is a technique for routing nets in a hierarchical circuit design without the above-described drawbacks.

SUMMARY

Some embodiments of the present invention provide a system that routes nets over circuit blocks in a hierarchical circuit design. Specifically, the embodiments route nets over circuit blocks to help a circuit design meet slew and timing requirements.

During operation, the system can receive a set of circuit blocks. Each circuit block can include a set of pins or terminals. At least some terminals may be desired to be electrically linked together using a net which is expected to be routed over one or more circuit blocks. The system may divide an area associated with a block into a set of tiles. For example, the system may divide an area in a metal layer which is situated above the block into a set of tiles. Next, the system may assign costs to at least some of the tiles in the set of tiles. The system can then use the costs during routing. The tile costs can be used as one of the components in a multi-component cost function that the routing engine uses to minimize the overall cost of the routed circuit design. Using the tile costs to route nets makes it more likely that long nets that are routed over circuit blocks will be able to use buffers to meet their slew and timing requirements.

The shape and dimensions of a tile and the cost of a tile can partially or fully depend on one or more factors. Specifically, the shape and dimensions of a tile can at least partially depend on which semiconductor manufacturing process is used for manufacturing the circuit design, which metal layer the tile is located on, and which block the tile is located on. Further, the cost of a tile can at least partially depend on the ease of accessibility to a buffer from the tile, which semiconductor manufacturing process is used for manufacturing the circuit design, which metal layer the tile is located on, and which block the tile is located on.

BRIEF DESCRIPTION OF THE FIGURES

FIGS. 4A-4G illustrate how tiling can be used to route nets over circuit blocks in accordance with an embodiment of the present invention.

DETAILED DESCRIPTION

The following description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data, so that when a computer system executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

Floorplanning and Routing

Figure 2:
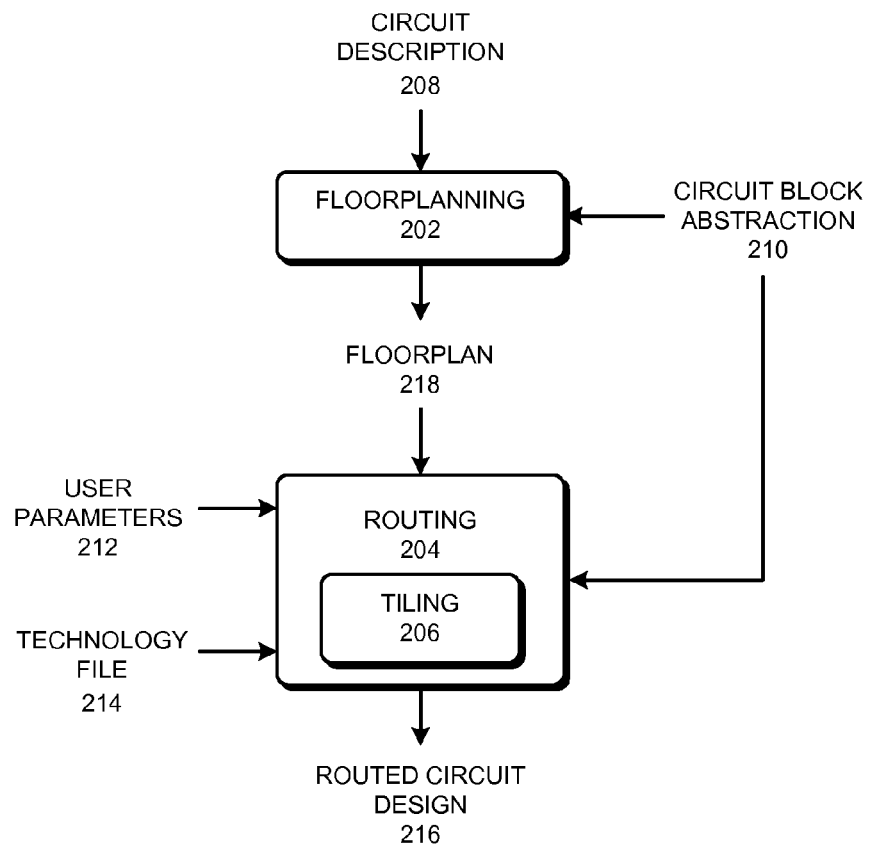
FIG. 2 presents a flowchart that illustrates a process for performing floorplanning and routing for a circuit design in accordance with an embodiment of the present invention.

FIG. 2 presents a flowchart that illustrates a process for performing floorplanning and routing for a circuit design in accordance with an embodiment of the present invention.

In floorplanning stage 202, the system can use circuit description 208 and circuit block abstraction 210 to generate floorplan 218, which specifies the location of each circuit element, and the electrical linkages that are desired to be created between the different circuit elements. Floorplan 218 may also specify the locations of buffers in the circuit design. Circuit block abstraction 210 may specify which circuit elements belong to which circuit blocks.

In routing stage 204, the system can use floorplan 218 to generate routed circuit design 216. Specifically, in some embodiments of the present invention, the system can perform tiling process 206 during routing stage 204, in which the system divides an area associated with a circuit block into tiles, and assigns costs to the tiles. Next, during routing stage 204, the system can use the costs to perform routing to obtain routed circuit design 216. Using the costs to route the net facilitates using buffers to ensure that the net meets slew and timing requirements.

Routing stage 204 can receive user parameters 212 as input, which can guide the routing process. For example, user parameters 212 may specify weights for nets which can enable the user to control which nets will be given priority during routing.

Routing stage 204 can also receive technology file 214 as input, which can specify various parameters related to the semiconductor manufacturing process that is expected to be used for manufacturing the circuit design. Information contained in technology file 214 can be used by tiling process 206 to determine the costs for the tiles.

Process for Routing Nets Over Circuit Blocks

Conventional approaches for routing nets over circuit blocks have serious drawbacks. In general, conventional approaches use a two-stage approach. In the first stage, the system routes the nets to minimize one or more metrics, such as, wire length, clock skew, area, etc. At the end of the first stage, there may be some nets that the system was unable to route. In the second stage, the system tries to use buffers to route these nets that the system was unable to route in the first stage.

Unfortunately, such post-route buffering approaches do not work well for large hierarchical designs. In contrast to such conventional approaches, some embodiments of the present invention incorporate buffering decisions into route planning.

Figure 3:
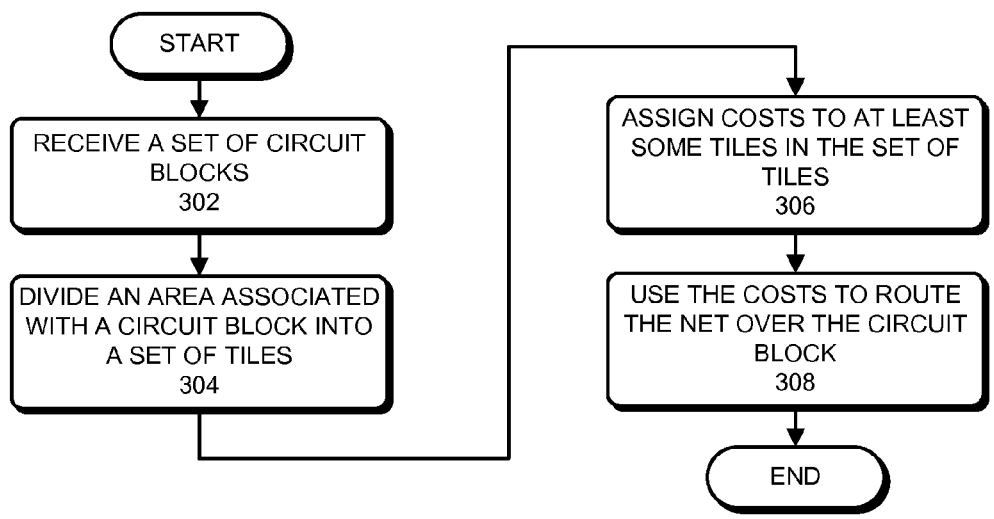
FIG. 3 presents a flowchart that illustrates a process for routing nets in a hierarchical circuit design in accordance with an embodiment of the present invention.

FIG. 3 presents a flowchart that illustrates a process for routing nets in a hierarchical circuit design in accordance with an embodiment of the present invention.

The process can begin by receiving a set of circuit blocks (step 302). One or more circuit blocks can each include a set of terminals, and at least some terminals from the same or different circuit blocks are desired to be electrically linked together using a net which is expected to be routed over one or more circuit blocks.

The system can then divide an area associated with a circuit block into a set of tiles (step 304). The shapes and dimensions of the tiles can partially or fully depend on one or more factors.

Next, the system can assign costs to at least some tiles in the set of tiles (step 306). The costs can partially or fully depend on one or more factors.

The system can then use the costs to route the net over the block (step 308). Note that using the costs of the tiles during routing makes it more likely that buffers can be used wherever required to meet slew and timing requirements. In some embodiments, the system can dynamically change the costs during routing. For example, as the routing process progresses, the system may determine that the current assignment of costs to the tiles may lead to a sub-optimal set of routes, and in response to such a determination, the system may adjust the costs of the tiles.

FIGS. 4A-4G illustrate how tiling can be used to route nets over circuit blocks in accordance with an embodiment of the present invention.

As shown in FIG. 4A, circuit design 400 can include circuit blocks 402, 404, and 406. Terminal 408 in circuit block 402 may be desired to be electrically linked with terminal 410 in circuit block 406.

The system can divide an area associated with a circuit block into a set of tiles. FIG. 4B illustrates how area 414, which is associated with circuit block 404, can be divided into a set of tiles. Specifically, area 414 can be an area in a layer which is situated above or below block 404. For example, area 414 can be in a metal layer that is located above block 404.

The shape and dimensions of a tile can depend on a variety of factors. Specifically, the shape and dimensions of a tile can at least partially depend on which semiconductor manufacturing process is used for manufacturing the circuit design, which metal layer the tile is located on, and which block the tile is located on. For example, at higher metal layers, the system may use larger tiles because the signal strength may not deteriorate with distance as quickly as it does at lower metal layers. Similarly, if the semiconductor manufacturing process is expected to result in chips that have low parasitic capacitances, the system may use larger tiles.

The shape and dimensions of a tile may also depend on a tradeoff between the quality of the routed circuit design and the performance of the routing process. In general, a smaller tile size may improve the quality of the routing solution because of the higher resolution, but may decrease performance because the routing process has to process a larger number of tiles. On the other hand, a larger tile size may decrease the quality of the routing solution because of the lower resolution, but may increase performance because there are fewer tiles.

Not all tiles have to be of the same shape or dimension, and the tiles can have irregular shapes. For example, FIG. 4C illustrates a tiling that is different from the tiling shown in FIG. 4B. Specifically, as shown in FIG. 4C, the set of tiles includes a large rectangular-shaped tile, namely tile 418, which is surrounded by smaller square-shaped tiles.

Once area 414 has been divided into a set of tiles, costs can be assigned to the tiles. Each tile can be assigned a cost based on a plurality of factors. Further, the system may use a cost function that uses the plurality of factors to determine the cost of a tile. Specifically, the cost of a tile can at least partially depend on the ease by which a buffer can be accessed from the tile, which semiconductor manufacturing process is used for manufacturing the circuit design, which metal layer the tile is located on, and which block the tile is located on.

For example, the system may assign a higher cost to a tile if the tile is located on a lower metal layer, but assign a lower cost to a tile if the tile is located on a higher metal layer. Such a cost assignment can cause the system to route long nets on higher metal layers and short nets on lower metal layers. Similarly, if a tile is near a buffer, the system may assign a low cost to the tile, whereas if a tile is far from a buffer, the system may assign a high cost.

FIG. 4D illustrates how costs can be assigned to tiles. The cost assignment shown in FIG. 4D encourages the routing process to route nets along the edge of area 414 so that a buffer can be easily added in the area between circuit blocks 402 and 404 if needed. FIG. 4E illustrates a different cost assignment to the tiles. Note that this cost assignment encourages using the bottom right corner of area 414, but discourages using the top right corner. A low cost may be assigned to tile 416 because an embedded repeater is available in circuit block 404 at that location.

Figure 1:
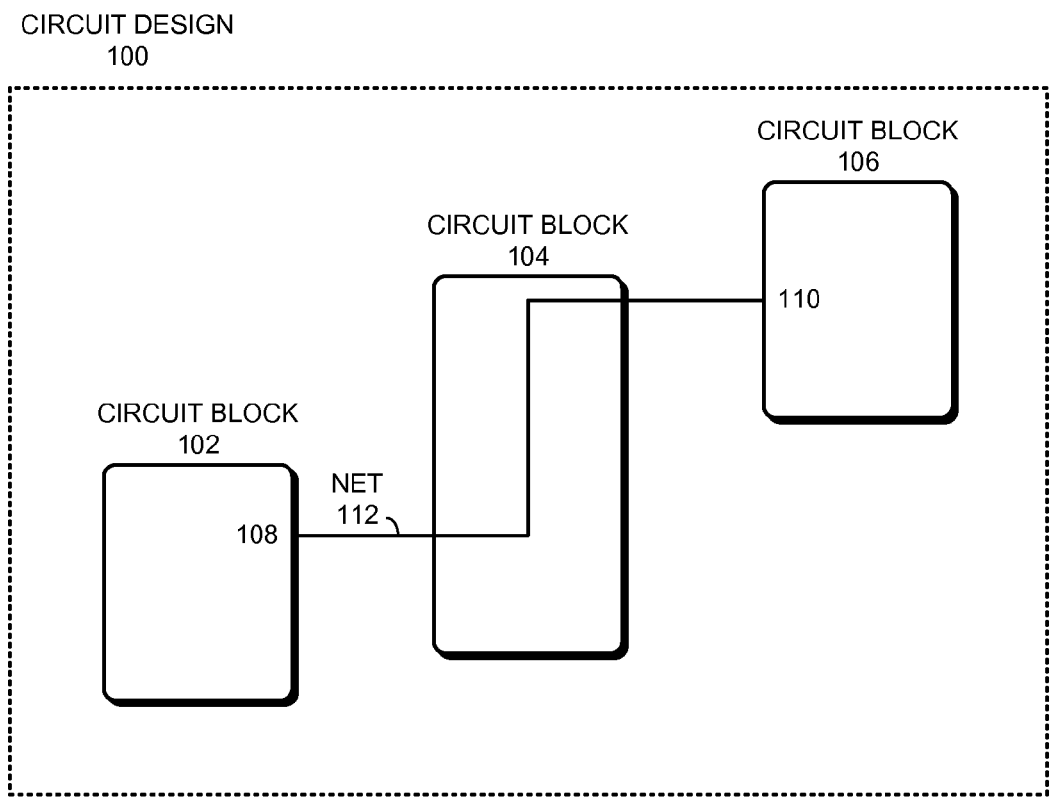
FIG. 1 illustrates a net that is routed over a circuit block in a hierarchical circuit design.
Figure 4F:
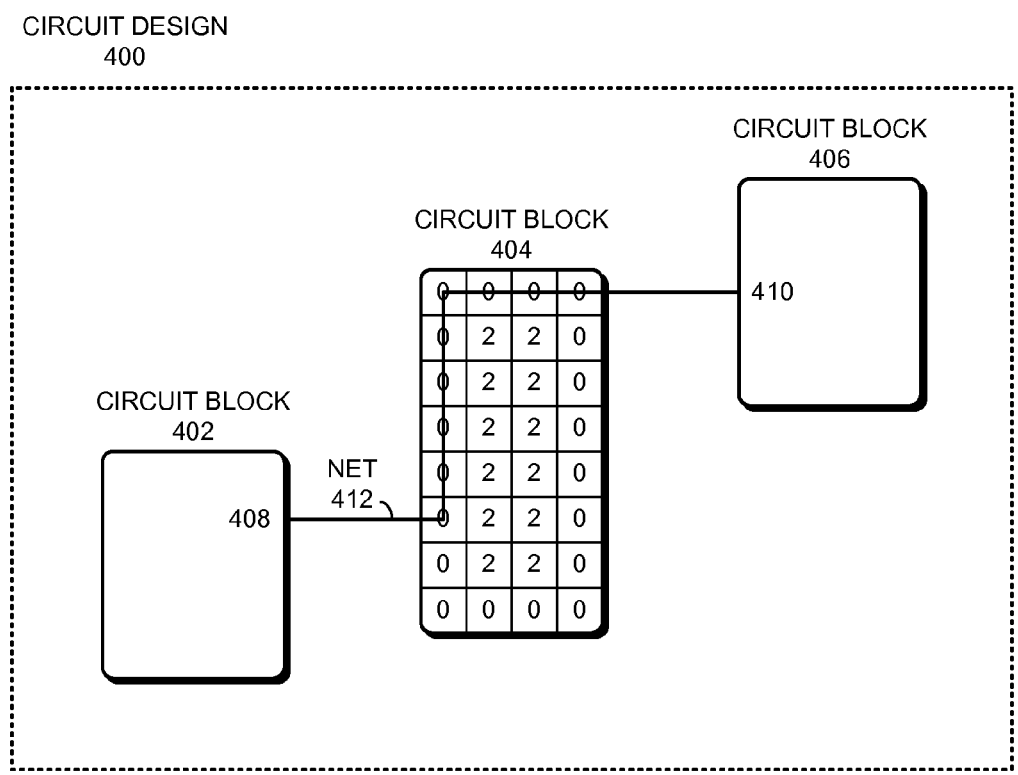
Figure 4G:
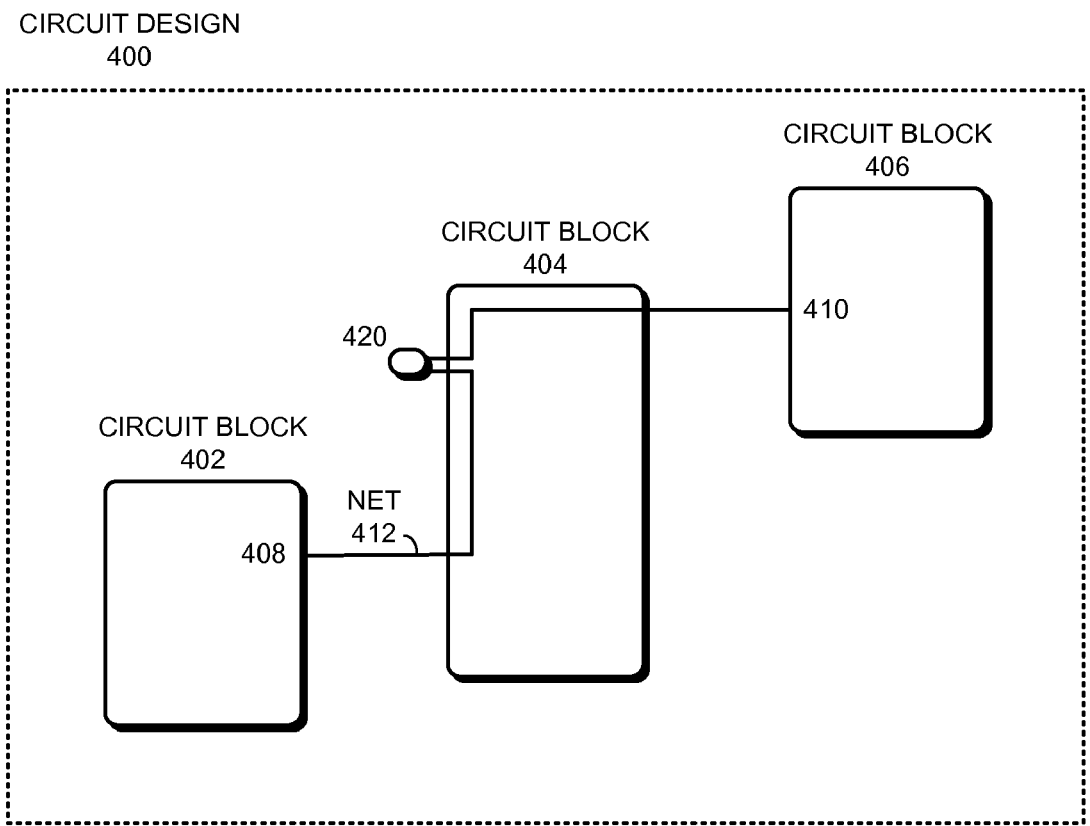

After assigning costs to the tiles, the system can route nets over the circuit blocks. FIG. 4F illustrates how net 412 can be routed over circuit block 404 to electrically link terminals 408 and 410. Note that net 412 has been routed along the edge of circuit block 404 because the routing process used the costs of the tiles to determine the route. FIG. 4G illustrates how a buffer can be added to net 412 to ensure that it meets the slew and/or timing requirements. Buffer 420 can be placed outside the edge of circuit block 404, and net 412 can be routed via buffer 420 to ensure that it meets its slew and/or timing requirements. Note that it may have not been possible to route net 412 via buffer 420 if net 412 had not been routed along circuit block 404's edges. For example, it may not be possible to route net 112 shown in FIG. 1 via buffer 420 because net 112 is routed through the middle of circuit block 404 instead of along circuit block 404's edges.

Computer System and Apparatus

Figure 5:
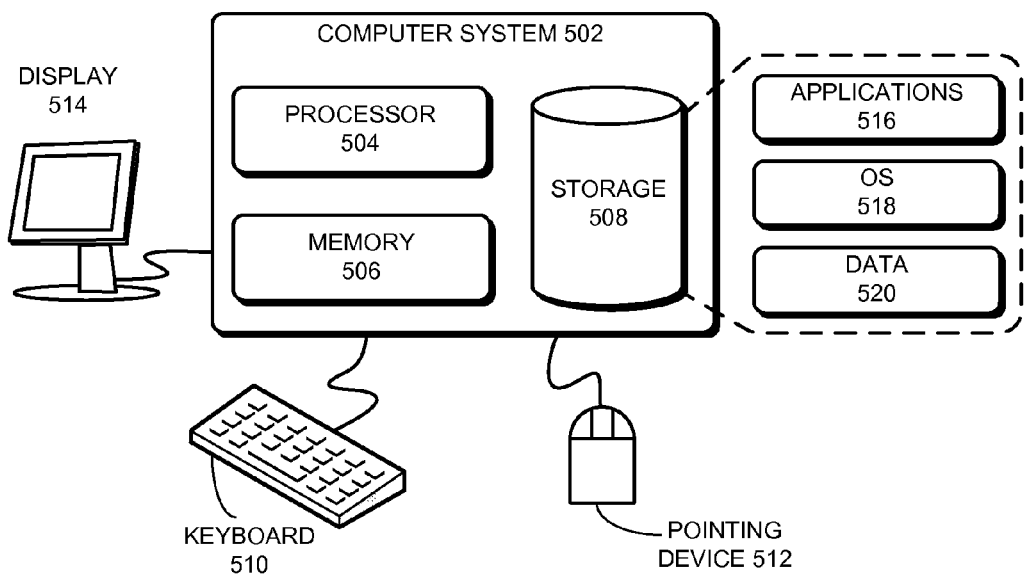
FIG. 5 illustrates a computer system in accordance with an embodiment of the present invention.

FIG. 5 illustrates a computer system in accordance with an embodiment of the present invention.

A computer system can generally be any system that can perform computations. Specifically, a computer system can be a microprocessor, a portable computing device, a personal organizer, or any other system, now known or later developed, that can perform computations. Computer system 502 comprises processor 504, memory 506, and storage 508. Computer system 502 can be coupled with display 514, keyboard 510, and pointing device 512.

Storage 508 can generally be any device that can store data. Specifically, a storage device can be a magnetic, an optical, or a magneto-optical storage device, or it can be based on flash memory and/or battery-backed up memory. Storage 508 can store applications 516, operating system 518, and data 520.

Applications 516 can include a routing tool to route nets in a hierarchical circuit design. Data 520 can include a circuit description, a circuit block abstraction, user parameters, technology data, a routed circuit design, or any other information that is an input or an output of an application that routes nets in a hierarchical circuit design.

Figure 6:
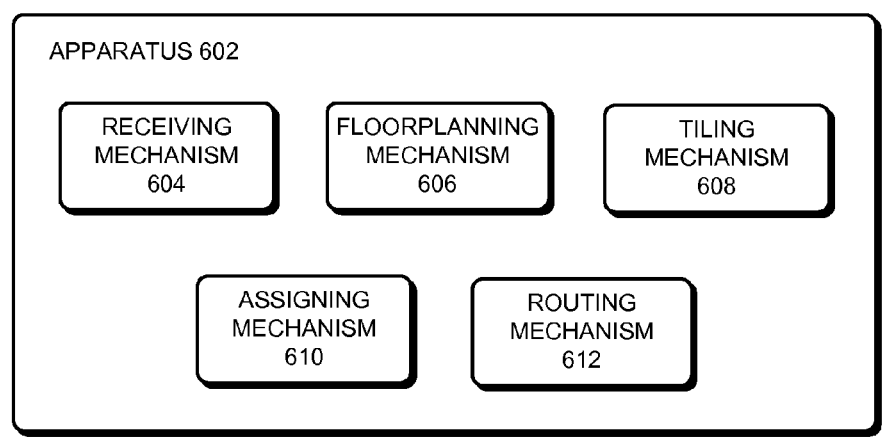
FIG. 6 illustrates an apparatus in accordance with an embodiment of the present invention.

FIG. 6 illustrates an apparatus in accordance with an embodiment of the present invention.

Apparatus 602 can comprise a number of mechanisms which may communicate with one another via a wired or wireless communication channel. Apparatus 602 may be realized using one or more integrated circuits, and it may be integrated in a computer system, or it may be realized as a separate device which is capable of communicating with other computer systems and/or devices. Specifically, apparatus 602 can comprise receiving mechanism 604, floorplanning mechanism 606, tiling mechanism 608, assigning mechanism 610, and routing mechanism 612.

In some embodiments, receiving mechanism 604 may be configured to receive a set of circuit blocks, floorplanning mechanism 606 may be configured to generate a floorplan, tiling mechanism 608 may be configured to divide an area associated with a circuit block into a set of tiles, assigning mechanism 610 may be configured to assign costs to the set of tiles, and routing mechanism 612 may be configured to use the costs to route nets over the circuit blocks.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for routing nets in a hierarchical circuit design, the method comprising:
   using at least one computer to perform operations for:
   receiving a set of circuit blocks, wherein a circuit block in the set of circuit blocks includes a set of terminals, and wherein at least some terminals are desired to be electrically linked together using a net which is expected to be routed over one or more circuit blocks;
   dividing an area associated with a circuit block into a set of tiles, wherein the area corresponds to a circuit layer above or below the circuit block;
   assigning costs to at least some tiles in the set of tiles; and
   using the costs to route the net over the circuit block, wherein routing the net over the circuit block comprises routing the net in the circuit layer.

2. The method of claim 1, wherein using the costs to route the net facilitates using buffers to ensure that the net meets slew and timing requirements.

3. The method of claim 1, wherein a tile's cost at least partially depends on ease of accessibility to a buffer from the tile.

4. The method of claim 1, wherein a tile's cost at least partially depends on which semiconductor manufacturing process is used for manufacturing the circuit design.

5. The method of claim 1, wherein a tile's cost at least partially depends on which block the tile is located on.

6. The method of claim 1, wherein a tile's shape and dimensions at least partially depend on which semiconductor manufacturing process is used for manufacturing the circuit design.

7. The method of claim 1, wherein a tile's shape and dimensions at least partially depend on which metal layer the tile is located on.

8. The method of claim 1, wherein a tile's shape and dimensions at least partially depend on which block the tile is located on.

9. The method of claim 1, wherein a tile's cost at least partially depends on which metal layer the tile is located on.

10. A non-transitory computer-readable storage medium storing instructions that when executed by a computer cause the computer to perform a method for routing nets in a hierarchical circuit design, the method comprising:
  receiving a set of circuit blocks, wherein a circuit block in the set of circuit blocks includes a set of terminals, and wherein at least some terminals are desired to be electrically linked together using a net which is expected to be routed over one or more circuit blocks;
  dividing an area associated with a circuit block into a set of tiles, wherein the area corresponds to a circuit layer above or below the circuit block;
  assigning costs to at least some tiles in the set of tiles; and
  using the costs to route the net over the circuit block, wherein routing the net over the circuit block comprises routing the net in the circuit layer.

11. The computer-readable storage medium of claim 10, wherein using the costs to route the net facilitates using buffers to ensure that the net meets slew and timing requirements.

12. The computer-readable storage medium of claim 10, wherein a tile's cost at least partially depends on ease of accessibility to a buffer from the tile.

13. The computer-readable storage medium of claim 10, wherein a tile's cost at least partially depends on which semiconductor manufacturing process is used for manufacturing the circuit design.

14. The computer-readable storage medium of claim 10, wherein a tile's cost at least partially depends on which block the tile is located on.

15. The computer-readable storage medium of claim 10, wherein a tile's shape and dimensions at least partially depend on which semiconductor manufacturing process is used for manufacturing the circuit design.

16. The computer-readable storage medium of claim 10, wherein a tile's shape and dimensions at least partially depend on which metal layer the tile is located on.

17. The computer-readable storage medium of claim 10, wherein a tile's shape and dimensions at least partially depend on which block the tile is located on.

18. The computer-readable storage medium of claim 10, wherein a tile's cost at least partially depends on which metal layer the tile is located on.

19. An apparatus for routing nets in a hierarchical circuit design, the apparatus comprising:
  a receiving mechanism configured to receive a set of circuit blocks, wherein a circuit block in the set of circuit blocks includes a set of terminals, and wherein at least some terminals are desired to be electrically linked together using a net which is expected to be routed over one or more circuit blocks;
  a tiling mechanism configured to divide an area associated with a circuit block into a set of tiles, wherein the area corresponds to a circuit layer above or below the circuit block;
  an assigning mechanism configured to assign costs to at least some tiles in the set of tiles; and
  a routing mechanism configured to use the costs to route the net over the circuit block, wherein routing the net over the circuit block comprises routing the net in the circuit layer.

20. The apparatus of claim 19, wherein using the costs to route the net facilitates using buffers to ensure that the net meets slew and timing requirements.

* * * * *